United States Patent [19]

Boeckeler

[11] 4,216,306

[45] Aug. 5, 1980

[54] FILM-FORMING POLYMERIZABLE RESIN OF BENZOPHENONE DIANHYDRIDE, EPOXY COMPOUND AND UNSATURATE CARBOXYLIC ACID

[75] Inventor: Rudolph H. Boeckeler, Grafton, Wis.

[73] Assignee: Freeman Chemical Corporation, Port Washington, Wis.

[21] Appl. No.: 22,799

[22] Filed: Mar. 22, 1979

[51] Int. Cl.² ............................................. C08G 59/42
[52] U.S. Cl. .................................. 528/115; 204/159.11; 204/159.22; 260/37 EP; 528/112; 528/220
[58] Field of Search ................... 260/37 EP; 528/112, 528/115, 220

[56] References Cited

U.S. PATENT DOCUMENTS

| | | | |
|---|---|---|---|
| 3,362,922 | 1/1968 | Manasia et al. | 528/220 |
| 3,388,185 | 6/1968 | Goldberg et al. | 528/215 |
| 3,989,573 | 11/1976 | Sanjana | 528/215 |

*Primary Examiner*—Lester L. Lee
*Attorney, Agent, or Firm*—Harry B. Keck; George E. Manias

[57] ABSTRACT

A film-forming polymerizable resin is produced from combining acrylic acid, the diglycidyl ether of N-butyl diol and 3,3',4,4'-benzophenone tetracarboxylic dianhydride (BTDA). The diglycidyl ether of N-butyl diol is combined with BTDA and sufficient acrylic acid to combine with unreacted epoxide groups. The BTDA constitutes 2 to 10 percent by weight of the three ingredients. The ingredients are heated to a low acid number where the epoxy equivalent of the mixture is greater than 3,500.

The resulting film-forming resin can be pigmented and can be cured in the presence of ultraviolet radiation.

5 Claims, No Drawings

FILM-FORMING POLYMERIZABLE RESIN OF BENZOPHENONE DIANHYDRIDE, EPOXY COMPOUND AND UNSATURATE CARBOXYLIC ACID

BACKGROUND OF THE INVENTION

1. Field of the Invention

This invention relates to film-forming polymerizable resins which can be cured through pendant acrylic radicals by exposure to ultraviolet radiation.

2. Description of the Prior Art

Utilization of ultraviolet radiation as an energy source for curing resins requires conversion of light energy into chemical energy. The conversion is usually accomplished by adding a photoinitiator or photosensitizer which absorbs light energy and creates reactive initiators for free radical polymerization of the resin. Photoinitiators convert light into chemical energy by direct formation of free radicals as in benzoin ethers or by interaction with another substance which donates a hydrogen atom to the photoactivated species and in doing so generates a free radical as in benzophenone reacting with tertiary hydroxyl amine. Most photoinitiators have one or more of the following undesirable characteristics:

high toxicity,
poor solubility,
high cost,
poor stability.

SUMMARY OF THE INVENTION

The present invention produces a radiation curable film-forming resin which has low toxicity and good stability. The present invention employs BTDA as a reactive ingredient in the preparation of the polymerizable polymer, despite the fact that BTDA is itself not an efficient initiator.

Polymerizable Monomer

The polymerizable monomer of this invention is the reaction product of (a) a monoepoxide, diepoxide or mixture thereof;
(b) an ethylenically unsaturated monocarboxylic acid such as acrylic acid or methacrylic acid or an ethylenically unsaturated dicarboxylic acid or anhydride thereof such as maleic acid or anhydride;
(c) BTDA.

Polymers of epoxide and acrylic acid are well-known as being curable when exposed to ultraviolet radiation. Such resins are normally produced by employing a slight excess of the acid ingredient so that substantially all of the epoxide radicals will be consumed in the formation of the polymer and the resulting polymer is substantially free of unreacted epoxide groups.

According to the present invention, a polymerizable resin is produced by combining an epoxide or diepoxide or mixture thereof as described, a carboxylic ingredient as described and BTDA which is 3,3',4,4'-benzophenone tetracarboxylic dianhydride. The BTDA constitutes 2 to 10 weight percent of the three ingredients. In the resulting resin, the BTDA is chemically combined and its toxicity and corrosiveness are reduced.

DESCRIPTION OF THE PREFERRED EMBODIMENTS

Example 1

A polymerizable resin was prepared by combining the following ingredients:

1720 grams diglycidyl ether of bisphenol-A;
572 grams aliphatic monoepoxide, the glycidyl ether of a $C_{12}$-$C_{14}$ alcohol;
161 grams BTDA;
756 grams acrylic acid;
22 grams triphenyl stibine;
8 grams triphenyl phosphine;
1.8 grams toluhydroquinone.

The ingredients were cooked at 100°–120° C. for 5 hours until the acid value reached 8.4. The epoxy equivalent was 3850. The viscosity, measured at 77° F. was 364,000 centipoises. The product was applied as a 1.5 mil film on a Bonderite 100 steel panel. The panel was passed at 35 feet per minute three times beneath a single UV lamp having 200 watts per inch output. The resulting coating had the following properties:

pencil hardness F;
cross-hatch adhesion—5% loss;
impact test
  forward—30 inch pounds,
  reverse—5 inch pounds;
double MEK rubs more than 100.

Example 2

The following ingredients were combined:

544 grams diglycidyl ether of 1,4-butane diol;
43 grams BTDA;
262.8 grams acrylic acid;
6 grams triphenyl stibine;
2 grams triphenyl phosphine;
0.2 grams toluhydroquinone;

The ingredients were mixed and heated at 100°–120° C. for 4 hours until the acid value reached 5.6 and the epoxy equivalent was 3800. The viscosity of the material was 4893 centipoises.

A 1.5 mil film of the resin was applied to a Bonderite 100 steel panel. The coated panel was passed once at 30 feet per minute beneath a single lamp having an output of 200 watts per inch. The film was mar-free and tack-free and had the following properties:

pencil hardness—2H;
cross-hatch adhesion—90% loss,
MEK double rubs more than 100.

Example 3

The following ingredients were mixed:

57.5 grams allyl glycidyl ether;
80.5 grams BTDA;
753.5 grams diglycidyl ether of 1,4-butane diol;
377 grams acrylic acid;
9.5 grams triphenyl stibine;
3.2 grams triphenyl phosphine;
0.5 grams toluhydroquinone.

The ingredients were mixed and heated at 100°–120° C. for 6 hours until the acid value was 8.9 and the epoxy equivalent greater than 5,000. Brookfield viscosity was 5200 cps measured at 25° C.

A 1.5 mil film of the product was applied to a Bonderite 100 steel panel and was cured mar-free and tack-free in a single pass at 30 feet per minute beneath a single mercury vapor lamp having an output of 200 watts per inch.

Example 4

240 grams of powdered titanium dioxide was milled into 600 grams of the resin produced in Example 2 until the mixture had a Hegeman fineness of 7. The filled product was applied as a 1 mil film to a Bonderite 100 steel panel. The panel cured mar-free and tack-free in two passes at 35 feet per minute beneath a single mercury vapor lamp having an output of 200 watts per inch.

SUMMARY

The present product has utility as a resinous ingredient in printing inks, for use as a fast curing coating composition to be applied to paper, metal, glass, plastic, wood, fabric, to be applied as a pigmented coating on the same substrates.

The particular advantage of the present composition is its low toxicity when in the liquid state before curing and also when cured.

I claim:

1. An auto-photoinitiated, polymerizable film-forming composition comprising the reaction product of
   (1) 3,3',4,4'-benzophenone tetracarboxylic acid dianhydride;
   (2) an organic epoxide resin having a molecular weight less than 1000 and selected from the class consisting of monoepoxide and diepoxide resins;
   (3) sufficient ethylenically unsaturated carboxylic acid or anhydride to combine with unreacted expoide radicals, selected from the class consisting of acrylic acid, methacrylic acid, maleic anhydride and maleic acid;

wherein the said ingredient (1) constitutes 2 to 10 percent of the combined weight of ingredients (1), (2) and (3);

said film-forming composition having a viscosity less than 500,000 centipoises, an acid value less than 10 and an epoxy equivalent weight greater than 3500.

2. The film-forming composition of claim 1 wherein the said organic epoxide resin is diglycidyl ether of bisphenol-A.

3. The film-forming composition of claim 1 wherein the said carboxylic acid is acrylic.

4. A cured film consisting of the polymerized film-forming composition of claim 1.

5. A film-forming composition according to claim 1 including finely divided filler.

* * * * *